US011538663B2

(12) United States Patent
Poulose et al.

(10) Patent No.: US 11,538,663 B2
(45) Date of Patent: Dec. 27, 2022

(54) METHODS AND APPARATUS FOR PROCESSING A SUBSTRATE

(71) Applicant: Applied Materials, Inc., Santa Clara, CA (US)

(72) Inventors: John Poulose, San Jose, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 152 days.

(21) Appl. No.: 17/183,034

(22) Filed: Feb. 23, 2021

(65) Prior Publication Data

US 2022/0270856 A1 Aug. 25, 2022

(51) Int. Cl.
*H03H 7/38* (2006.01)
*H01J 37/32* (2006.01)

(52) U.S. Cl.
CPC ......... *H01J 37/32183* (2013.01); *H03H 7/38* (2013.01)

(58) Field of Classification Search
CPC ............................ H01J 37/32183; H03H 7/38
See application file for complete search history.

(56) References Cited

U.S. PATENT DOCUMENTS

| 8,357,264 B2 | 1/2013 | Shannon et al. |
| 9,082,589 B2 | 7/2015 | Thomas et al. |
| 9,124,241 B2 | 9/2015 | Lee |
| 9,595,423 B2 | 3/2017 | Leray et al. |
| 10,347,465 B2 | 7/2019 | Ayoub et al. |
| 10,593,516 B2 | 3/2020 | Marakhtanov et al. |
| 2008/0284537 A1 | 11/2008 | Ikenouchi |
| 2009/0284156 A1 | 11/2009 | Banna et al. |
| 2015/0349750 A1 | 12/2015 | Van Zyl et al. |
| 2016/0086772 A1 | 3/2016 | Khaja et al. |
| 2019/0148114 A1* | 5/2019 | Wu .................. H01L 21/68757 156/345.48 |
| 2019/0180986 A1* | 6/2019 | Torii .................. H01L 21/3065 |

(Continued)

FOREIGN PATENT DOCUMENTS

| JP | 05-182597 A | 7/1993 |
| JP | 2001-230207 A | 8/2001 |

OTHER PUBLICATIONS

International Search Report and Written Opinion for PCT/US2021/064296 dated Apr. 13, 2022.

(Continued)

*Primary Examiner* — Henry Luong
(74) *Attorney, Agent, or Firm* — Moser Taboada

(57) ABSTRACT

Methods and apparatus for processing a substrate are provided herein. For example, a matching network configured for use with a plasma processing chamber comprises an input configured to receive one or more radio frequency (RF) signals, an output configured to deliver the one or more RF signals to a processing chamber, a first variable capacitor disposed between the input and the output, a second variable capacitor disposed in parallel to the first variable capacitor, a third variable capacitor connected in parallel with each of the first variable capacitor and the second variable capacitor and in series with a transistor switch, and a controller configured to tune the matching network between a first frequency for high-power operation and a second frequency for low-power operation.

16 Claims, 3 Drawing Sheets

(56) References Cited

U.S. PATENT DOCUMENTS

| | | |
|---|---|---|
| 2019/0318915 A1 | 10/2019 | Nagami et al. |
| 2020/0212869 A1 | 7/2020 | Morii |
| 2020/0411289 A1 | 12/2020 | Radomski et al. |
| 2022/0076923 A1* | 3/2022 | Carroll .................... H05H 1/46 |

OTHER PUBLICATIONS

International Search Report and Written Opinion for PCT/US2021/064488 dated Apr. 13, 2022.

* cited by examiner

METHODS AND APPARATUS FOR PROCESSING A SUBSTRATE

FIELD

Embodiments of the present disclosure generally relate to methods and apparatus for processing substrates, and more particularly, to methods and apparatus for processing substrates using radio frequency (RF) plasma.

BACKGROUND

Methods and apparatus for processing substrates in a vacuum processing chamber using one or more of RF power sources are known (e.g configured for single level pulsing or dual level pulsing). For example, in single level pulsing (e.g., pulsing between an on state and an off state), there is only one state to tune to (e.g., the on state). In dual level pulsing, however, the RF power source is switched between a high state and a low state (e.g., not an off state).

A matching network is often connected between the RF power source and the vacuum processing chamber and configured to ensure that an output of the RF power source is efficiently coupled to the plasma to maximize an amount of energy coupled to the plasma (e.g., referred to as tuning the RF power delivery). For example, in dual level pulsing, there are two or more impedance states that require impedance matching. Current matching networks are configured to use analog capacitors (e.g., in series or shunt) to time average tune to one state and frequency tuning in the other state in real time. Frequency tuning, however, is limited in impedance matching due to single axis tuning, which, in turn, can result in limited process capabilities and increased reflected power.

SUMMARY

Methods and apparatus for processing a substrate are provided herein. In some embodiments, a matching network configured for use with a plasma processing chamber comprises an input configured to receive one or more radio frequency (RF) signals, an output configured to deliver the one or more RF signals to a processing chamber, a first variable capacitor disposed between the input and the output, a second variable capacitor disposed in parallel to the first variable capacitor, a third variable capacitor connected in parallel with each of the first variable capacitor and the second variable capacitor and in series with a transistor switch, and a controller configured to tune the matching network between a first frequency for high-power operation and a second frequency for low-power operation.

In accordance with at least some embodiments, a matching network configured for use with a plasma processing chamber comprises an input configured to receive one or more radio frequency (RF) signals, an output configured to deliver the one or more RF signals to a processing chamber, a first variable capacitor disposed in parallel between the input and the output, a second variable capacitor disposed in parallel to the first variable capacitor, and a third variable capacitor connected in parallel with each of the first variable capacitor and the second variable capacitor and in series with a transistor switch, wherein the matching network is tunable between a first frequency for high-power operation and a second frequency for low-power operation within a pulse period of low-power operation of one or more RF bias power sources to which the matching network is configured to connect to.

In accordance with at least some embodiments, a plasma processing chamber comprises a chamber body and a chamber lid, a RF source power connected to the chamber lid and configured to create a plasma from gases disposed in a processing region of the chamber body, one or more RF bias power sources configured to sustain a plasma discharge, and a matching network comprising an input configured to receive one or more radio frequency (RF) signals from the one or more RF bias power sources, an output configured to deliver the one or more RF signals to the plasma processing chamber, a first variable capacitor disposed between the input and the output, a second variable capacitor disposed in parallel to the first variable capacitor, a third variable capacitor connected in parallel with each of the first variable capacitor and the second variable capacitor and in series with a transistor switch, and a controller configured to tune the matching network between a first frequency for high-power operation and a second frequency for low-power operation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
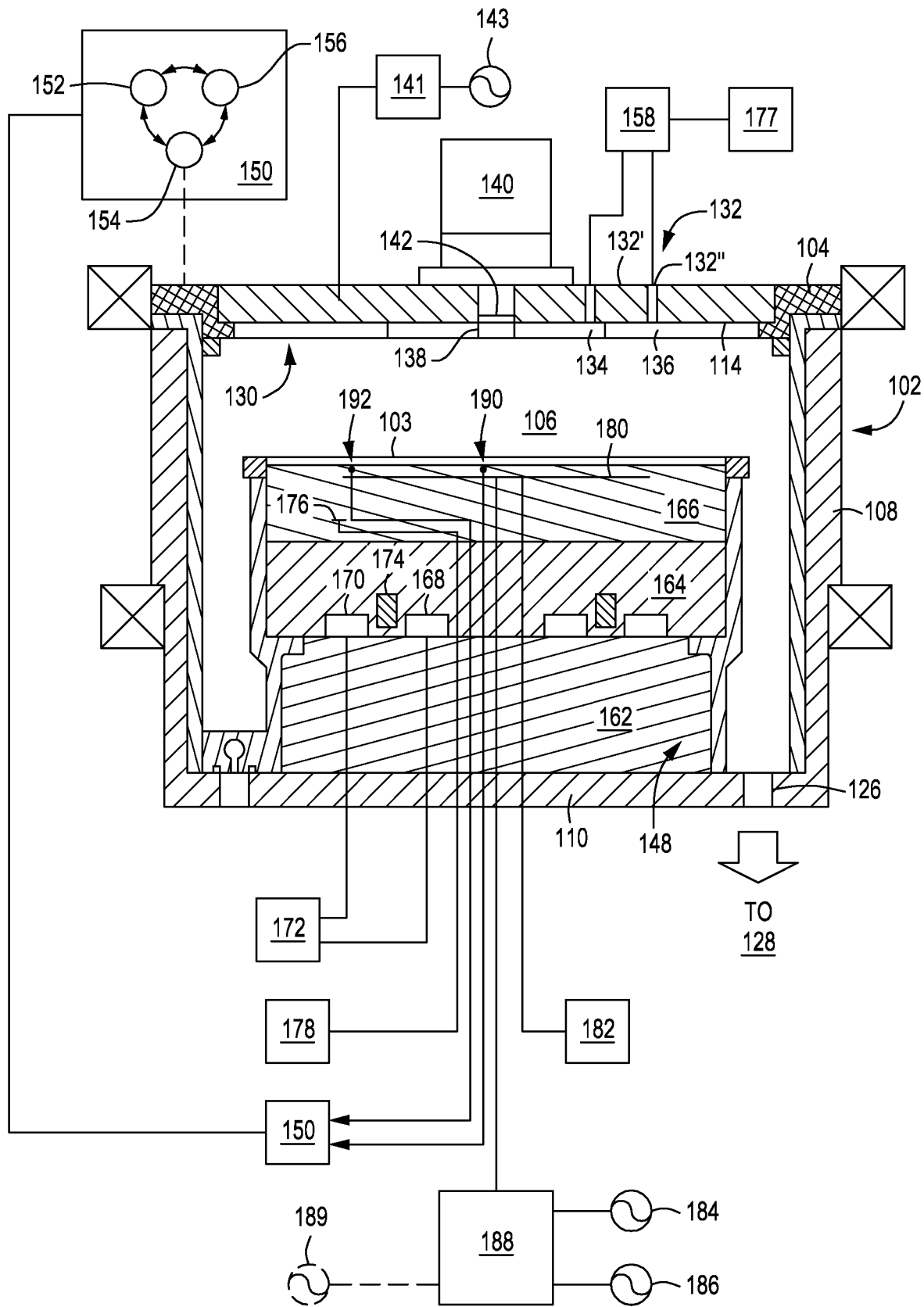
FIG. 1 is a cross-sectional view of processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, the methods and apparatus use radio frequency (RF) impedance tuning. More particularly, one or more matching networks are configured to tune between a high-power state and a low-power state. For example, in at least some embodiments, one or more variable capacitors of the matching network are configured to tune to the high-power state and, using frequency tuning, a transistor switch, can be used to switch to the low-power state, e.g., fast switched. The matching networks described herein can one or more of be configured to provide electrical transient circuit protection to a generator of the plasma processing chamber and can be tuned to the pulse period of the generator during low-power operation. In at least some embodiments, the matching networks described herein, as compared to conventional matching networks, can provide one or more of low control voltage development, low parasitic loss, better signal to noise ratio (S/N), or continuous instead of discreet impedance step when compared to conventional matching networks.

FIG. 1 is a sectional view of one example of a processing chamber 100 suitable for performing an etch process in accordance with the present disclosure. Suitable processing chambers that may be adapted for use with the teachings disclosed herein include, for example, one or more etch processing chambers available from Applied Materials, Inc. of Santa Clara, Calif. Other processing chambers may be adapted to benefit from one or more of the methods of the present disclosure.

The processing chamber 100 includes a chamber body 102 and a chamber lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In embodiments, the pump system 128 maintains the pressure inside the interior volume 106 at operating pressures typically between about 1 mTorr to about 500 mTorr, between about 5 mTorr to about 100 mTorr, or between about 5 mTorr to 50 mTorr depending upon process needs.

In embodiments, the chamber lid 104 is sealingly supported on the sidewall 108 of the chamber body 102. The chamber lid 104 may be opened to allow excess to the interior volume 106 of the processing chamber 100. The chamber lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the chamber lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed.

In embodiments, a gas panel 158 is coupled to the processing chamber 100 to provide process and/or cleaning gases to the interior volume 106. In the example depicted in FIG. 1, inlet ports 132', 132" are provided in the chamber lid 104 to allow gases to be delivered from the gas panel 158 to the interior volume 106 of the processing chamber 100. In embodiments, the gas panel 158 is adapted to provide oxygen and inert gas such as argon, or oxygen and helium process gas or gas mixture through the inlet ports 132', 132" and into the interior volume 106 of the processing chamber 100. In one embodiment, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium In some embodiments, a chlorine gas may be provided alone, or in combination with at least one of nitrogen, helium an inert gas such as argon. Non-limiting examples of oxygen containing gas includes one or more of $O_2$, $CO_2$, $N_2O$, $NO_2$, $O_3$, $H_2O$, and the like. Non-limiting examples of nitrogen containing gas includes $N_2$, $NH_3$, and the like. Non-limiting examples of chlorine containing gas includes HCl, $Cl_2$, $CCl_4$, and the like. In embodiments, a showerhead assembly 130 is coupled to an interior surface 114 of the chamber lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to the gas panel 158 to facilitate dissociating gas mixture from a remote plasma prior to entering the interior volume 106 for processing. In some embodiments, a RF source power 143 is coupled through a matching network 141 to the showerhead assembly 130. The RF source power 143 typically can produce up to about 5000 W for example between about 200 W to about 5000 W, or between 1000 W to 3000 W, or about 1500 W and optionally at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the chamber lid 104.

In one embodiment, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through inlet ports 132', 132".

In some embodiments, the substrate support pedestal assembly 148 is disposed in the interior volume 106 of the processing chamber 100 below the gas distribution assembly such as showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown)

in a conventional manner. An inner liner 118 may closely circumscribe the periphery of the substrate support pedestal assembly 148.

In one embodiment, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises an electrode 180 (e.g., a clamping electrode) for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum, or gravity.

A base 164 or electrostatic chuck 166 may include a heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 arid the substrate 103. In embodiments, the temperature of the substrate may be maintained at 20 degrees Celsius to 450 degrees Celsius, such as 100 degrees Celsius to 300 degrees Celsius, or 150 degrees Celsius to 250 degrees Celsius.

In one embodiment, the substrate support pedestal assembly 148 is configured as a cathode and includes an electrode 180 that is coupled to a plurality of RF bias power sources 184, 186. The RF bias power sources 184, 186 are coupled between the electrode 180 disposed in the substrate support pedestal assembly 148 and another electrode, such as the showerhead assembly 130 or the chamber lid 104) of the chamber body 102. The RF bias power excites and sustains a plasma discharge formed from the gases disposed in the processing region of the chamber body 102.

Still referring to FIG. 1, in some embodiments the dual RF bias power sources 184, 186 are coupled to the electrode 180 disposed in the substrate support pedestal assembly 148 through a matching network 188. The signal generated by the RF bias power sources 184, 186 is delivered through matching network 188 to the substrate support pedestal assembly 148 through a single feed to ionize the gas mixture provided in the plasma processing chamber such as processing chamber 100, thus providing ion energy necessary for performing an etch deposition or other plasma enhanced process. The RF bias power source 184, 186 are generally capable of producing an RF signal having a frequency of from about 50 kHz to about 200 MHz (e.g., about 13.56 MHz +/−5%) and a power between about 0 Watts and about 6000 Watts (e.g., from about 50 W for low-power operation to about 6000 W for high-power operation), 1 Watt (W) to about 100 W, or about 1 W to about 30 W. An additional bias power 189 may be coupled to the electrode 180 to control the characteristics of the plasma.

During operation, the substrate 103 is disposed on the substrate support pedestal assembly 148 in the plasma processing chamber such as the processing chamber 100. A process gas and/or gas mixture is introduced into the chamber body 102 through the showerhead assembly 130 from the gas panel 158. A vacuum pump system such as pump system 128 maintains the pressure inside the chamber body 102 while removing deposition by-products.

A controller 150 is coupled to the processing chamber 100 to control operation of the processing chamber 100. The controller 150 includes a central processing unit 152, a memory 154, and a support circuit 156 utilized to control the process sequence and regulate the gas flows from the gas panel 158. The central processing unit 152 may be any form of general-purpose computer processor that may be used in an industrial setting. The software routines can be stored in the memory 154, such as random-access memory, read only memory, floppy, or hard disk drive, or other form of digital storage. The support circuit 156 is conventionally coupled to the central processing unit 152 and may include cache, clock circuits, input/output systems, power supplies, and the like. Bi-directional communications between the controller 150 and the various components of the processing chamber 100 are handled through numerous signal cables.

Figure 2:
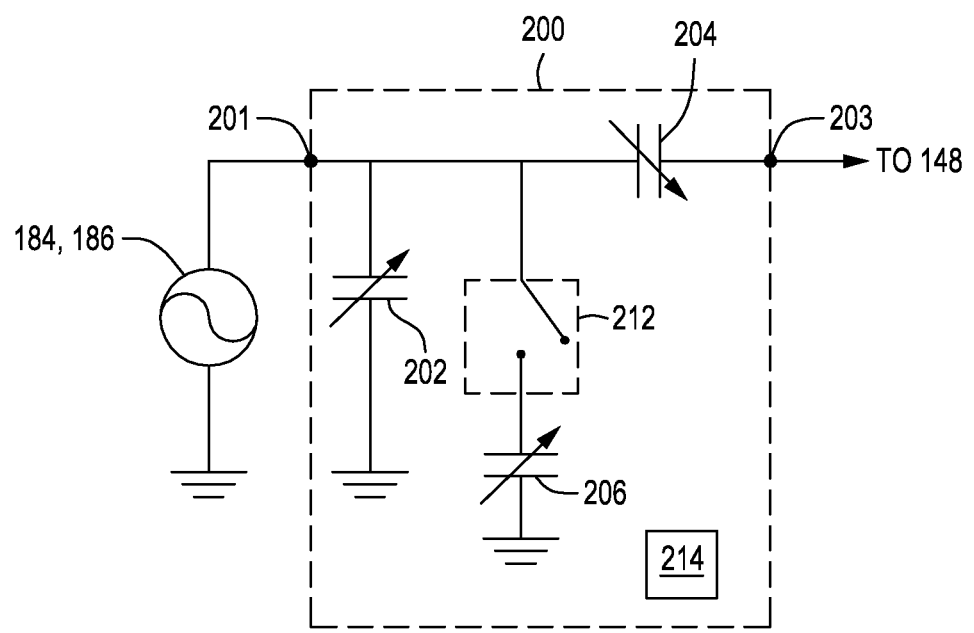
FIG. 2 is a schematic diagram of a matching network in accordance with at least some embodiments of the present disclosure.

FIG. 2 is a schematic diagram of a matching network 200 (e.g., a switched dual shunt matching network) in accordance with at least some embodiments of the present disclosure. The matching network 200 is configured for use with a plasma processing chamber, e.g., a physical vapor deposition chamber, chemical vapor deposition chamber, atomic layer deposition, etch chamber, or other processing chamber that uses a matching network. For illustrative purpose, the matching network 200 (e.g., the matching network 141 and/or the matching network 188) is described herein with respect to an etch chamber, e.g., the processing chamber 100.

The matching network 200 includes an input stage 201 configured to connect to an RF power supply (e.g., RF bias power sources 184, 186) of a plasma processing chamber and configured to receive one or more radio frequency (RF) signals and an output stage 203 configured to connect to a substrate support pedestal assembly (e.g., the substrate support pedestal assembly 148) of the processing chamber and configured to deliver the one or more RF signals to a processing chamber.

The matching network 200 includes one or more variable (tunable) capacitors, such as a first variable capacitor 202 and a second variable capacitor 204 disposed in parallel to the first variable capacitor. The first variable capacitor 202 and the second variable capacitor 204 have variable capacitances that allow the first variable capacitor 202 and the second variable capacitor 204 to be tuned to one or frequencies. For example, in at least some embodiments, the first variable capacitor 202 and the second variable capacitor 204 can have a capacitance of about 50 F to about 500 pF. In at least some embodiments, such as when a processing chamber is operating in a high-power state or low-power state, the first variable capacitor 202 and the second variable capacitor 204 can be tuned to one or more of the above described frequencies.

The match network 200 comprises a third variable capacitor 206 connected in parallel with the first variable capacitor 202 and the second variable capacitor 204 and in series with a transistor switch 212. The first variable capacitor 202 and the second variable capacitor 204 can be the same as each other. The third variable capacitor 206 can be configured similarly to the first variable capacitor 202 and the second variable capacitor 204.

The transistor switch 212 can be any suitable transistor switch, such as transistors that are operable at high frequencies, e.g., a gallium nitride transistor switch that is configured for high frequency switching greater than 100 MHz. The transistor switch 212 is configured to turn on during a low-power state and turn off during high-power state. For example, the transistor switch 212 is configured to facilitate transition between high-power operation (e.g., high impedance) and low-power operation (e.g., low impedance), as will be described in greater detail below. In high-power operation, the transistor switch 212 is in the off configuration.

In at least some embodiments, the first variable capacitor 202, the second variable capacitor 204, and the transistor switch 212 can be part of a vacuum package. The vacuum package allows the transistor switch 212 to perform switching in vacuum, e.g., with minimum inductance (feed length) that connects to the first variable capacitor 202 and the second variable capacitor 204, which can eliminate the effects of ringing or oscillation due to suddenly switching on or off a capacitor. The feed length of the connection to the transistor switch 212 can give rise to an equivalent inductor.

In at least some embodiments, the matching network 200 can include a controller 214 (e.g., controller 150) configured to tune the matching network 200 between a first frequency for high-power operation and a second frequency for low-power operation. The controller 214 is configured to tune the matching network 200 between the first frequency for high-power operation and the second frequency for low-power operation, e.g., within a pulse period of low-power operation, about 2 μs to about 50 μs. The controller 214 is configured to measure reflected power during high-power operation and low-power operation and tune the matching network 200 to reduce the reflected power.

Figure 3:
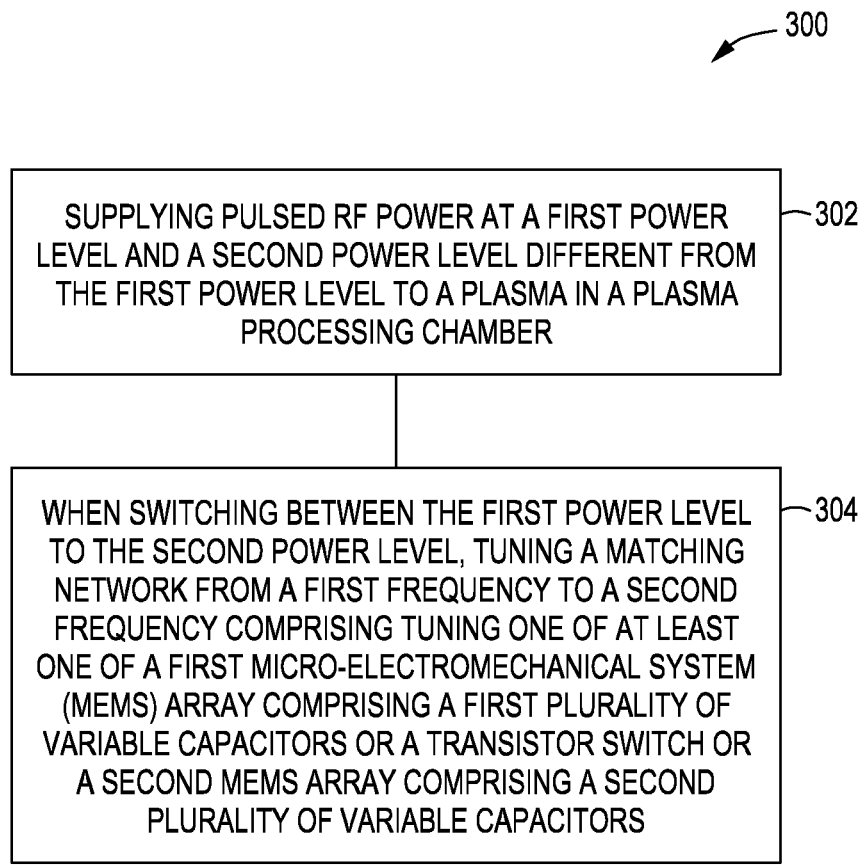
FIG. 3 is a flowchart of a method of processing a substrate in accordance with at least some embodiments of the present disclosure.

FIG. 3 is a flowchart of a method 300 of processing a substrate in accordance with at least some embodiments of the present disclosure.

At 302, the method 300 includes supplying pulsed RF power at a first power level and a second power level different from the first power level to a plasma in a plasma processing chamber. For example, in at least some embodiments, the controller 150 is configured to control one or both the RF bias power sources 184, 186 to provide a first power level (e.g., high-power of about 6000 W) and a second power level (e.g., low-power of about 50 W) to a plasma in a plasma processing chamber.

During application of high-power, the controller 150 is configured to adjust one or more of the previously described matching networks to ensure that impedance matching can be achieved during operation. For example, during high-power operation, with respect to the matching network 200, the controller 150 can be configured to tune the first variable capacitor 202 and/or the second variable capacitor 204 to one or more frequencies for impedance matching between an output of the RF bias power sources 184, 186 and the processing chamber 100. As noted above, in high-power operation, the transistor switch 212 is in the off configuration and the third variable capacitor 206 will be inactive for frequency tuning and impedance matching.

Next, at 304, when switching between the first power level to the second power level, the method 300 includes tuning the matching network from a first frequency to a second frequency.

For example, in low-power operation the controller 150 can be configured to turn on the transistor switch 212. For example, in at least some embodiments, a TTL signal can be transmitted to the controller 150 to turn on the transistor switch 212. With the transistor switch 212 in the on configuration, the third variable capacitor 206 will be active and provide frequency tuning and impedance matching in low-power operation. For example, in low-power operation, the first variable capacitor 202 and the second variable capacitor 204 will be inactive for frequency tuning and impedance matching, and the third variable capacitor 206 will be active for frequency tuning and impedance matching between an output of the RF bias power sources 184, 186 and the processing chamber 100. For example, the third variable capacitor 206 can be tuned within a pulse period of the RF bias power sources 184, 186 during lower power operation.

While the foregoing is directed to embodiments of the present disclosure, other and further embodiments of the disclosure may be devised without departing from the basic scope thereof.

The invention claimed is:

1. A matching network configured for use with a plasma processing chamber, comprising:
   an input configured to receive one or more radio frequency (RF) signals;
   an output configured to deliver the one or more RF signals to the plasma processing chamber;
   a first variable capacitor disposed between the input and the output;
   a second variable capacitor disposed in parallel to the first variable capacitor;
   a third variable capacitor connected in parallel with each of the first variable capacitor and the second variable capacitor and in series with a transistor switch; and
   a controller configured to tune the matching network between a first frequency for high-power operation and a second frequency for low-power operation,
   wherein the matching network is configured such that in the low-power operation the transistor switch and the third variable capacitor are in an off configuration.

2. The matching network of claim 1, wherein the controller is further configured to receive a TTL signal to activate the transistor switch.

3. The matching network of claim 1, wherein the controller is configured to tune the matching network within a pulse period of low-power operation.

4. The matching network of claim 1, wherein the matching network is configured such that in the high-power operation the first variable capacitor and the second variable capacitor are in an on configuration.

5. The matching network of claim 1, wherein a capacitance of the first variable capacitor, the second variable capacitor, and the third variable capacitor is about 50 F to about 500 pF.

6. The matching network of claim 1, wherein the first variable capacitor and the second variable capacitor are the same as each other and different from the third variable capacitor.

7. The matching network of claim 1, further comprising an input stage configured to connect to an RF power supply of the plasma processing chamber and an output stage configured to connect to a substrate support pedestal assembly of the plasma processing chamber.

8. The matching network of claim 1, wherein the transistor switch is a gallium nitride transistor switch.

9. A matching network configured for use with a plasma processing chamber, comprising:
an input configured to receive one or more radio frequency (RF) signals;
an output configured to deliver the one or more RF signals to the plasma processing chamber;
a first variable capacitor disposed in parallel between the input and the output;
a second variable capacitor disposed in parallel to the first variable capacitor; and
a third variable capacitor connected in parallel with each of the first variable capacitor and the second variable capacitor and in series with a transistor switch,
wherein the matching network is tunable between a first frequency for high-power operation and a second frequency for low-power operation within a pulse period of low-power operation of one or more RF bias power sources to which the matching network is configured to connect to,
wherein the matching network is configured such that in the low-power operation the transistor switch and the third variable capacitor are in an off configuration.

10. A plasma processing chamber, comprising:
a chamber body and a chamber lid;
a RF source power connected to the chamber lid and configured to create a plasma from gases disposed in a processing region of the chamber body;
one or more RF bias power sources configured to sustain a plasma discharge; and
a matching network comprising:
an input configured to receive one or more radio frequency (RF) signals from the one or more RF bias power sources;
an output configured to deliver the one or more RF signals to the plasma processing chamber;
a first variable capacitor disposed between the input and the output;
a second variable capacitor disposed in parallel to the first variable capacitor;
a third variable capacitor connected in parallel with each of the first variable capacitor and the second variable capacitor and in series with a transistor switch; and
a controller configured to tune the matching network between a first frequency for high-power operation and a second frequency for low-power operation,
wherein the matching network is configured such that in the low-power operation the transistor switch and the third variable capacitor are in an off configuration.

11. The plasma processing chamber of claim 10, wherein the controller is further configured to receive a TTL signal to activate the transistor switch.

12. The plasma processing chamber of claim 10, wherein the controller is configured to tune the matching network within a pulse period of low-power operation.

13. The plasma processing chamber of claim 10, wherein the matching network is configured such that in the high-power operation the first variable capacitor and the second variable capacitor are in an on configuration.

14. The plasma processing chamber of claim 10, wherein a capacitance of the first variable capacitor, the second variable capacitor, and the third variable capacitor is about 50 F to about 500 pF.

15. The plasma processing chamber of claim 10, further comprising an input stage configured to connect to an RF power supply of the plasma processing chamber and an output stage configured to connect to a substrate support pedestal assembly of the plasma processing chamber.

16. The plasma processing chamber of claim 10, wherein the transistor switch is a gallium nitride transistor switch.

* * * * *